(12) United States Patent
Iguchi (10) Patent No.: US 9,431,451 B2
(45) Date of Patent: Aug. 30, 2016

(54) ARRAY-TYPE LIGHT-RECEIVING DEVICE (71) Applicant: SUMITOMO ELECTRIC INDUSTRIES, LTD., Osaka-shi, Osaka (JP)

(72) Inventor: Yasuhiro Iguchi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/631,655

(22) Filed: Feb. 25, 2015

(65) Prior Publication Data
US 2015/0249108 A1    Sep. 3, 2015

(30) Foreign Application Priority Data
Feb. 28, 2014 (JP) .................................. 2014-038992

(51) Int. Cl.
| H01L 27/146 | (2006.01) |
| H01L 31/0304 | (2006.01) |
| H01L 31/0352 | (2006.01) |

(52) U.S. Cl.
CPC ..... *H01L 27/14643* (2013.01); *H01L 27/1464* (2013.01); *H01L 27/14629* (2013.01); *H01L 31/03042* (2013.01); *H01L 31/03046* (2013.01); *H01L 31/035236* (2013.01)

(58) Field of Classification Search
None
See application file for complete search history.

(56) References Cited

U.S. PATENT DOCUMENTS

| 5,952,645 | A  * | 9/1999  | Wang ............... H01L 27/14627 |
| | | | 250/208.1 |
| 7,242,069 | B2 * | 7/2007  | Bui ..................... H01L 27/1464 |
| | | | 257/414 |
| 8,228,408 | B2 * | 7/2012  | Tay ................... H01L 27/14625 |
| | | | 348/280 |
| 9,123,839 | B2 * | 9/2015  | Cheng ............... H01L 31/02327 |
| 9,202,950 | B2 * | 12/2015 | Choi .................. H01L 31/0232 |
| 2002/0011640 | A1 * | 1/2002 | Bauer ................ H01L 27/14652 |
| | | | 257/443 |
| 2004/0104351 | A1 * | 6/2004 | Shibayama ......... H01L 27/1446 |
| | | | 250/370.11 |
| 2008/0128846 | A1 * | 6/2008 | Bui ..................... B23K 1/0016 |
| | | | 257/437 |
| 2011/0162699 | A1 * | 7/2011 | Shappir ............. H01L 31/0236 |
| | | | 136/255 |
| 2013/0292646 | A1 * | 11/2013 | Iguchi .............. H01L 31/02327 |
| | | | 257/21 |

FOREIGN PATENT DOCUMENTS

JP    2001-144278    5/2001

* cited by examiner

*Primary Examiner* — Benjamin Sandvik
(74) *Attorney, Agent, or Firm* — Smith, Gambrell & Russell, LLP.

(57) ABSTRACT

An array-type light-receiving device includes a substrate including a main surface, a rear surface, and a plurality of recesses formed in the rear surface, the rear surface including an incident plane on which incident light is received; a stacked semiconductor layer disposed on the main surface of the substrate, the stacked semiconductor layer including a light-receiving layer; and a plurality of pixel regions each of which includes the light-receiving layer. The plurality of recesses are each depressed from the rear surface in a thickness direction of the substrate. In addition, each of the plurality of recesses has a bottom surface and a side surface, the bottom surface facing at least one of the plurality of pixel regions, the side surface including a tapered region inclined at a predetermined inclination angle with respect to an in-plane direction of the main surface.

6 Claims, 9 Drawing Sheets

ARRAY-TYPE LIGHT-RECEIVING DEVICE

BACKGROUND OF THE INVENTION

1. Field of the Invention

The present invention relates to an array-type light-receiving device.

2. Description of the Related Art

Japanese Unexamined Patent Application Publication No. 2001-144278 discloses a technique related to a light-receiving device array, which includes a plurality of light-receiving devices having a mesa-type structure. The light-receiving devices each include are n-InP substrate, an n-InP layer, an i-InGaAs layer, a p-InP layer, a p-type ohmic electrode, and an n-type ohmic electrode. The i-InGaAs layer is served as a light receiving layer. The n-InP layer, the i-InGaAs layer, and the p-InP layer are stacked on the n-InP substrate in order. The light-receiving devices are each covered with an insulating film. The light-receiving device array has a groove formed between two adjacent light-receiving devices. The groove of the light-receiving device array is formed by etching portions of the i-InGaAs layer and the p-InP layer disposed between the two light-receiving devices. Each two adjacent light-receiving devices are separated from each other by the groove formed between the two light-receiving devices. The p-type ohmic electrode is disposed on the p-InP layer. The n-type ohmic electrode is disposed on the rear surface of the n-InP substrate.

SUMMARY OF THE INVENTION

In a light-receiving device that receives incident light on the rear surface of the substrate (i.e., "back-illuminated-type light-receiving device"), part of the incident light is absorbed by the substrate of the light-receiving device. Therefore, when the substrate has a larger thickness in order to obtain mechanical strength, for example, the light-receiving device has a smaller sensitivity because the amount of light incident on the light receiving layer in the pixel region through the substrate is reduced by the absorption of light in the substrate. In addition, when light is incident on the groove of the light-receiving device array, the light incident on the groove also does not reach the light receiving layer in the pixel region. Therefore, the sensitivity of the light-receiving device is further reduced.

An array-type light-receiving device according to an embodiment of the present invention includes a substrate including a main surface, a rear surface, and a plurality of recesses formed in the rear surface, the rear surface including an incident plane on which incident light is received; a stacked semiconductor layer disposed on the main surface of the substrate, the stacked semiconductor layer including a light-receiving layer; and a plurality of pixel regions each of which includes the light-receiving layer. The plurality of recesses are each depressed from the rear surface in a thickness direction of the substrate. In addition, each of the plurality of recesses has a bottom surface and a side surface, the bottom surface facing at least one of the plurality of pixel regions, the side surface including a tapered region inclined at a predetermined inclination angle with respect to an in-plane direction of the main surface.

DESCRIPTION OF THE PREFERRED EMBODIMENTS

Brief Description of the Embodiments

Embodiments of the present invention are described below. An array-type light-receiving device according to a first embodiment includes a substrate including a main surface, a rear surface, and a plurality of recesses formed in the rear surface, the rear surface including an incident plane on which incident light is received; a stacked semiconductor layer disposed on the main surface of the substrate, the stacked semiconductor layer including a light-receiving layer; and a plurality of pixel regions each of which includes the light-receiving layer. The plurality of recesses are each depressed from the rear surface in a thickness direction of the substrate. Each of the plurality of recesses has a bottom surface and a side surface, the bottom surface facing at least one of the plurality of pixel regions, the side surface including a tapered region inclined at a predetermined inclination angle with respect to an in-plane direction of the main surface. In addition, the plurality of recesses may be disposed around the center of the rear surface. The rear surface may include an outer periphery region surrounding the plurality of recesses.

In the array-type light-receiving device according to the first embodiment, the outer periphery region of the substrate has a lager thickness than that of the region in which the recesses are formed. Therefore, the substrate has a larger mechanical strength as compared with the substrate without the outer periphery region. In addition, the recesses face the respective pixel regions. A portion of the substrate in which the recess is formed has a smaller thickness than that of other portions in which the recess is not provided. Thus, light incident through the recesses facing the respective pixel regions is less absorbed by the substrate as compared with light incident through the other portions of the substrate in which the recess is not provided. This allows the proportion of incident light absorbed by the substrate to be reduced while maintaining the overall thickness of the substrate large. As a result, a sufficient amount of incident light is allowed to reach the pixel regions through the substrate. Therefore, the sensitivity of the array-type light-receiving device is improved by forming recesses facing the respective pixel regions in the rear surface of the substrate. Furthermore, in the array-type light-receiving device, the side surfaces of the recesses each include a tapered region. The incident light is reflected at the side surface of the recess having the tapered region, and then is concentrated onto the corresponding pixel region. Therefore, the sensitivity of the array-type light-receiving device is further improved. As described above, the array-type light-receiving device according to the first embodiment allows a sufficient amount of light to be incident on the pixel regions while maintaining the mechanical strength of the device high.

An array-type light-receiving device according to a second embodiment may further include a high reflection (HR) coating that reflects the incident light, the high reflection coating being disposed on at least one of the side surfaces of the plurality of recesses, in the array-type light-receiving device according to the second embodiment, the incident light is effectively reflected by the high reflection (HR) coating disposed on the side surface of the recess toward the corresponding pixel region.

In an array-type light-receiving device according to a third embodiment, preferably, each of the plurality of pixel regions includes a light-receiving plane in the light-receiving layer, the light-receiving plane extending along the main surface of the substrate. Each of the bottom surfaces of the plurality of recesses faces the light-receiving plane. In addition, the inclination angle satisfies the relational expression:

$$90° \geq \theta \geq 45° \text{ and } (L2-L1)/(2 \times L3) \geq \tan(2\theta) \geq -(L1+L2)/(2 \times L3),$$

where θ represents the inclination angle, L1 represents a pitch at which the plurality of recesses are arranged, L2 represents a diameter of the light-receiving plane, and L3 represents a distance from the rear surface to the light-receiving plane. By setting the inclination angle (θ) in the above-described condition, the light incident on each recess is guided toward the corresponding pixel region facing the recess.

In an array-type light-receiving device according to the third embodiment, each of the plurality of pixel regions may include a p-n junction in the light-receiving layer, and the light-receiving plane may be substantially disposed at the p-n junction.

In an array-type light-receiving device according to a fourth embodiment, the plurality of pixel regions may be included in the stacked semiconductor layer. Each of the plurality of pixel regions may include a p-n junction in the light-receiving layer. In addition, the p-n junction may be formed by selectively diffusing zinc (Zn) impurity from a surface of the stacked semiconductor layer.

In an array-type light-receiving device according to a fifth embodiment, each of the plurality of pixel regions may include a mesa portion that is defined by a mesa groove. Each of the mesa portions may include the light-receiving layer of the stacked semiconductor layer. The mesa portions are disposed on the main surface of the substrate. In addition, the plurality of pixel regions are separated from each other by the mesa groove. In the array-type light-receiving device according to the fifth embodiment, it is difficult that carriers generated in one of the pixel regions diffuse to the other pixel regions through the mesa groove G1. Therefore, the occurrence of crosstalk between adjacent pixel regions is reduced.

DETAILED DESCRIPTION OF THE EMBODIMENTS

The specific examples of the array-type light-receiving devices according to the embodiments of the present invention are described below with reference to the attached drawings. Note that the present invention is not limited by the following examples and all modifications that are equivalent to and fall within the scope of the appended claims are intended to be included herein. The same elements and elements having the same function are denoted by the same reference numeral, and duplicated description thereof is omitted.

Figure 1:
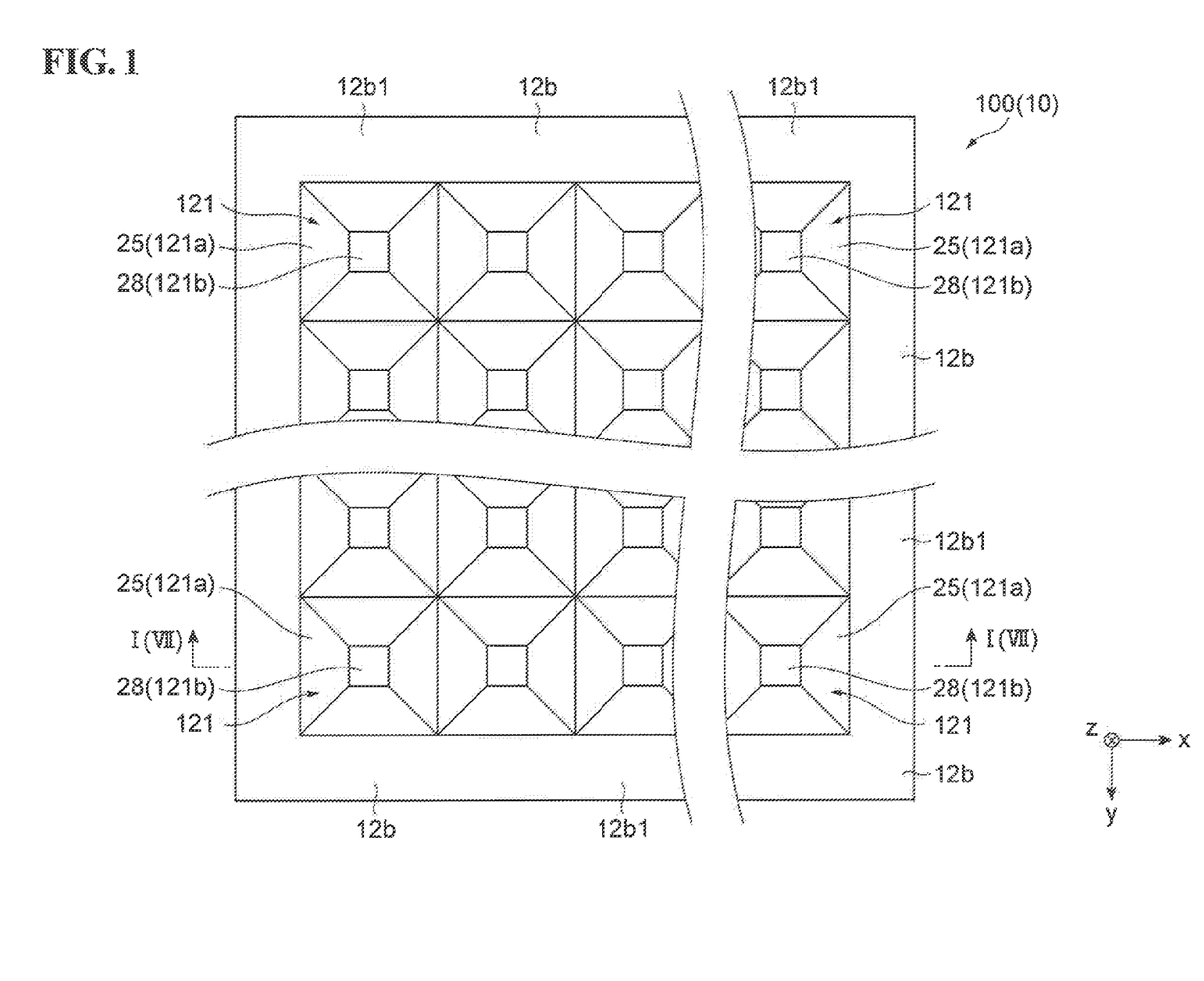
FIG. 1 is a diagram illustrating the rear surface of a sensing apparatus according to an embodiment of the present invention.
Figure 2:
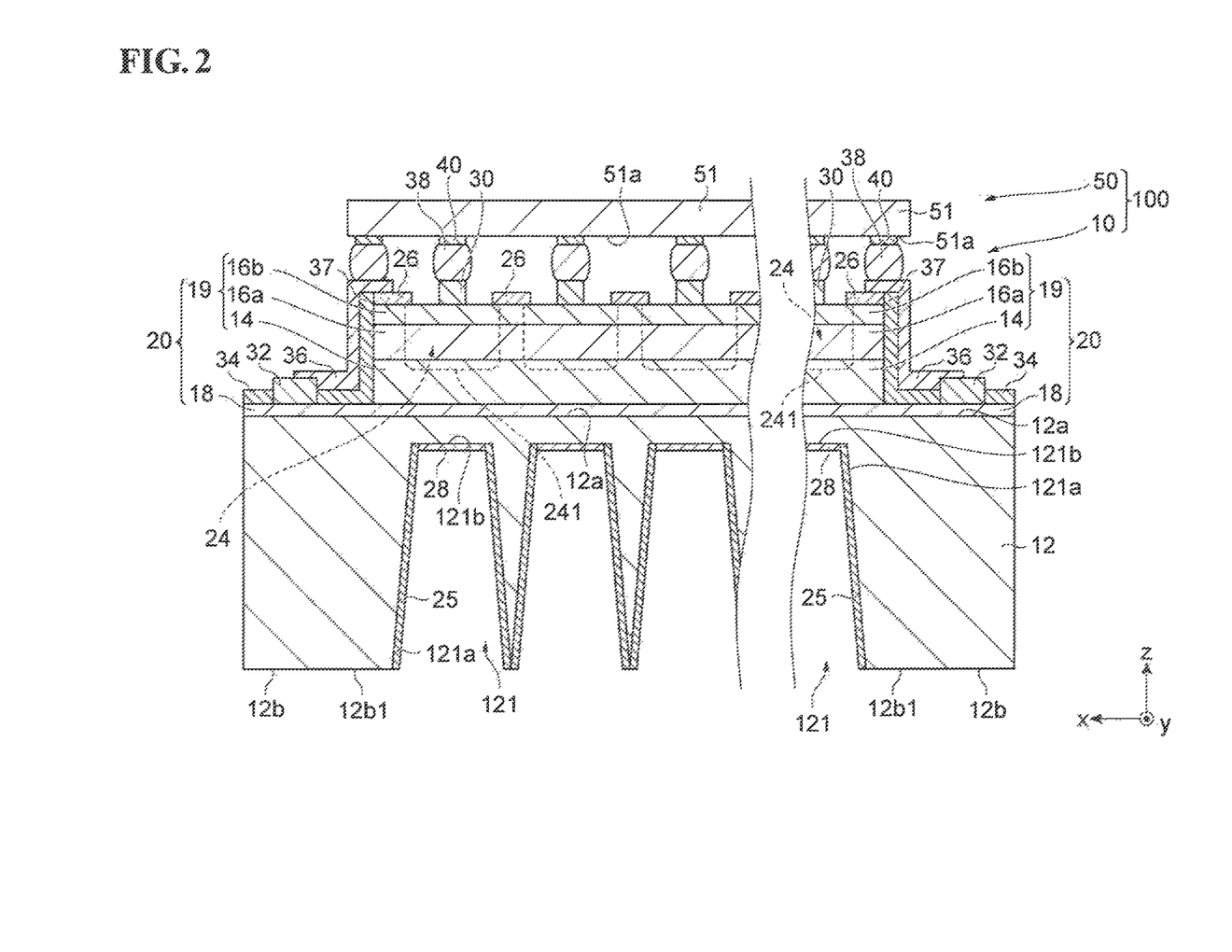
FIG. 2 is a diagram illustrating the inside of a sensing apparatus according to an embodiment of the present invention.
Figure 3:
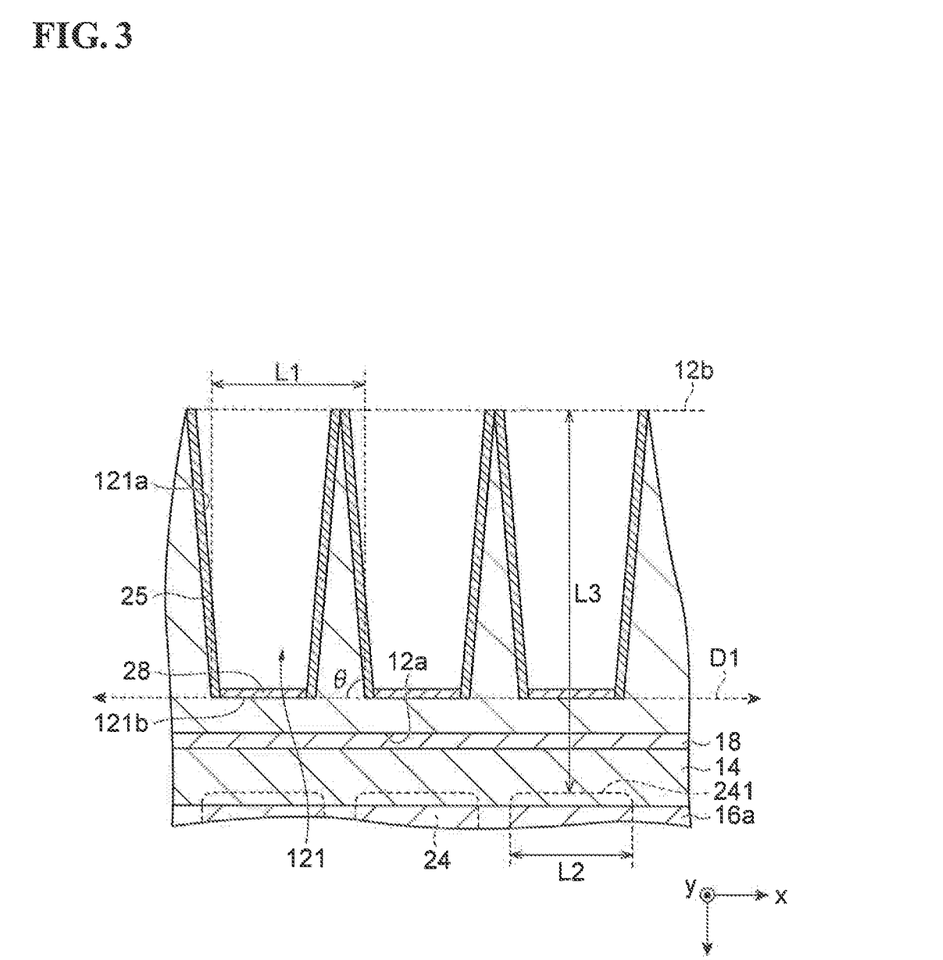
FIG. 3 is a diagram illustrating the inside of an array-type light-receiving device according to an embodiment of the present invention.

Now, an array-type light-receiving device 10 according to an embodiment of the present invention is described with reference to FIGS. 1, 2, and 3. The array-type light-receiving device 10 is used in a sensing apparatus 100. FIG. 1 is a diagram illustrating the rear surface of the sensing apparatus 100, that is, a rear surface 12b of the array-type light-receiving device 10. The xyz coordinate system is shown in FIG. 1. The rear surface of the sensing apparatus 100 (i.e., the rear surface 12b of the array-type light-receiving device 10) is perpendicular to the z-axis. FIG. 2 is a diagram illustrating the inside of the sensing apparatus 100, which is a cross-sectional view (zx-plane) taken along the line I-I shown in FIG. 1 viewed in the direction of the arrow. The xyz-coordination system shown in FIG. 2 is the same as in FIG. 1. FIG. 3 is a diagram illustrating the inside of the array-type light-receiving device 10, which is a cross-sectional view (zx-plane) taken along the line I-I shown in FIG. 1 viewed in the direction of the arrow. The xyz-coordination system indicated in FIG. 3 is the same as that indicated in FIG. 2. FIGS. 5A, 5B, 5C, 6A, 6B, 6C, 7A, and 7B are diagrams for explaining the main steps of a method for producing the sensing apparatus 100. FIGS. 5A to 7B are diagrams illustrating the inside of the product, which are cross-sectional views (zx-planes) taken along the line I-I viewed in the direction of the arrow, similarly to FIGS. 2 and 3.

The sensing apparatus 100 includes the array-type light-receiving device 10 and a read-out integrated circuit (IC) 50 connected to the array-type light-receiving device 10. The array-type light-receiving device 10 includes a substrate 12, a stacked semiconductor layer 20, high reflection (HR) coatings 25, an insulating film 26, anti-reflection (AR) coatings 28, electrodes 30, an electrode 32, an insulating film 34, a wiring electrode 36, and an insulating film 37. The substrate 12 includes a main surface 12a, a rear surface 12b that serves as a light-incident plane, and a plurality of recesses 121. The stacked semiconductor layer 20 includes a light-receiving layer 14 and a plurality of pixel regions 24. Each of the plurality of pixel regions 24 includes a p-type impurity region formed by selectively diffusing zinc (Zn) impurity as a p-type impurity from the surface of the stacked semiconductor layer 20, for example. In the embodiment, the light-receiving layer 14 is composed of a non-doped semiconductor layer. In this case, the light-receiving layer 14 has an n-type conductivity, and a background concentration of the n-type impurity in the light-receiving layer 14 is about $1 \times 10^{16}$ cm$^{-3}$ or less. Therefore, in each of the plurality of pixel regions 24, a p-n junction is formed at a boundary between the p-type impurity region and an n-type region of the light-receiving layer 14. Thus, the p-n junction is formed in the light-receiving layer 14. The plurality of pixel regions 24 are electrically separated from each other by the p-n junction. The whole of the plurality of pixel regions 24 includes, for example, 320×256 pixel regions arranged in the form of a two-dimensional array. Thus, the array-type light-receiving device 10 includes the 320×256 pixel regions. The plurality of pixel regions 24 are arranged so that 320 pixel regions are arranged in one direction and 256 pixel regions are arranged in another direction perpendicular to the direction in which the 320 pixel regions are arranged. Each of the 320×256 pixel regions has a top surface that is arranged on the surface of a second cap layer 16b of the stacked semiconductor layer 20. Each of the pixel regions 24 includes a p-n junction in the light-receiving layer 14. The stacked semiconductor layer 20 is disposed on the main surface 12a of the substrate 12. The plurality of recesses 121 are formed in the rear surface 12b of the substrate 12. The plurality of recesses 121 are each depressed from the rear surface 12b of the substrate 12 in the thickness direction of the substrate 12. The plurality of recesses 121 are each disposed opposite to the corresponding one of the plurality of pixel regions 24.

The thickness of the substrate 12 is, for example, 50 μm. The substrate 12 is composed of for example, InP and doped with an impurity such as Fe. The plurality of recesses 121 of the substrate 12 are arranged in the rear surface 12b of the substrate 12 in the form of a two-dimensional array. In the embodiment, bottom surfaces 121b of the plurality of recesses 121 are each disposed opposite to the corresponding one of the plurality of pixel regions 24. The bottom surface 121b of the plurality of recess 121 may face at least one of the plurality of pixel regions 24. The plurality of recesses 121 are disposed at the center of the rear surface 12b. The plurality of recesses 121 are arranged so as to be surrounded by an outer periphery region 12b1 of the rear surface 12b of the substrate. The outer periphery region 12b1 extends along the outer periphery of the rear surface 12b. The plurality of recesses 121 includes 320×256 recesses, which correspond to the pixel regions 24. Thus, the array-type light-receiving device 10 includes 320×256 recesses 121. Similarly to the pixel regions 24, the plurality of recesses 121 are arranged so that 320 recesses are arranged in one direction and 256 recesses are arranged in another direction perpendicular to the direction in which 320 recesses are arranged. The thickness of the substrate 12 is larger in the outer periphery region 12b1 than in the bottom surfaces 121b of the recesses 121.

The side surfaces 121a of the plurality of recesses 121 each include a tapered region. The tapered region of each side surface 121a is inclined at a predetermined inclination angle with respect to the in-plane direction D1 of the main surface 12a (see FIG. 3). The plurality of pixel regions 24 each include a light-receiving plane 241 located inside the light-receiving layer 14. The light-receiving plane 241 is substantially disposed at a boundary of each pixel region 24 at which the p-n junction is formed by selectively diffusing zinc (Zn) impurity as a p-type impurity as described above. Therefore, the light-receiving plane 241 is substantially disposed at the p-n junction. The light-receiving plane 241 extends along the main surface 12a. The bottom surfaces 121b of the plurality of recesses 121 each face the light-receiving plane 241. Each bottom surface 121b overlaps the corresponding light-receiving plane 241 when viewed in plan. The high reflection (HR) coating 25 is disposed on the side surface 121a so as to reflect light incident on the rear surface 12b of the substrate 12 from the outside. In the embodiment, the high reflection coating 25 is disposed on each of the side surfaces 121a of the plurality of recesses 121. The high reflection coating 25 may be disposed on at least one of the side surfaces of the plurality of recesses.

Figure 4:
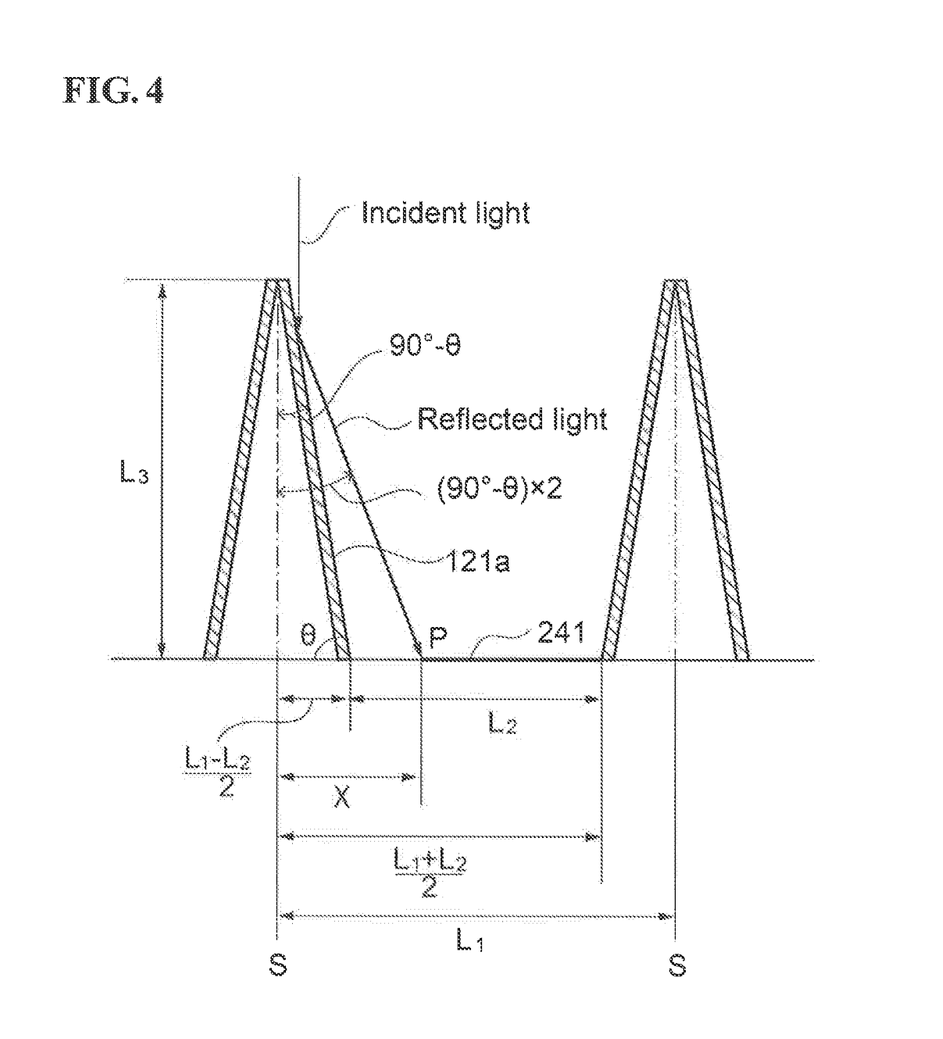
FIG. 4 is a diagram illustrating a mechanism by which light incident on an array-type light-receiving device according to an embodiment of the present invention is reflected by the side surface of the recess and then incident onto the light-receiving plane of the array-type light-receiving device.

In FIG. 3, θ represents an angle at which the tapered region of each side surface 121a is inclined with respect to the in-plane direction D1 of the main surface 12a. L1 represents a pitch at which the recesses 121 are arranged. L2 represents a diameter of the light-receiving plane 241. Here, the L2 represents a distance across the light-receiving plane 241. For example, the L2 represents a diameter of the light-receiving plane 241 when the light-receiving plane 241 had a circular shape. The L2 represents a length of a diagonal line of the light-receiving plane 241 when the light-receiving plane 241 had a polygonal shape. L3 represents the distance from the rear surface 12b to the light-receiving plane 241. It is assumed that light is incident on the light-receiving plane 241 substantially at a right angle. FIG. 4 schematically illustrates a mechanism by which the incident light is reflected by the side surface 121a of the recess 121 and then incident onto the light-receiving plane 241. In FIG. 4, a reference line S is a line that passes through the apex of the side surface 121a and is perpendicular to the main surface 12a, and P denotes a point at which the incident light reaches the light-receiving plane 241. In order to allow the incident light reflected by the side surface 121a of the recess 121 to reach the light-receiving plane 241, the distance x from the reference line S to the point P needs to satisfy the following condition:

$$(L1-L2)/2 \leq x \leq (L1+L2)/2 \quad (1)$$

$$x = L3 \times \tan(180° - 2\theta) \quad (2)$$

Rearranging Formulae (1) and (2) yields the following relationship:

$$(L2-L1)/(2 \times L3) \geq \tan(2\theta) \geq -(L1+L2)/(2 \times L3),$$

where θ is in the range 45°≤θ≤90°

The above relationship is necessary for concentrating light incident on the recess 121 on the pixel region 24 facing the recess 121 and thereby guiding the incident light toward the light-receiving plane 241 in the light-receiving layer 14, effectively. In this embodiment, the entire side surface 121a of the recess 121 constitutes a tapered region. Alternatively, a portion of the side surface 121a of the recess 121 may be a tapered region. The shape of the opening of the recess 121 is, for example, a square having a diagonal line of 10 μm (i.e., 7.07-μm square) or a circle having a diameter of 10 μm when viewed in plan. For example, when the arrangement pitch L1 is 30 μm, the diameter L2 of the light-receiving plane 241 is 10 μm, and the distance L3 from the rear surface 12b to the light-receiving plane 241 is 50 μm, the inclination angle θ is set to 79.1° or more to 84.3° or less.

The stacked semiconductor layer 20 includes the light-receiving layer 14, a first cap layer 16a, a second cap layer 16b, a buffer layer 18, and the plurality of pixel regions 24. The buffer layer 18, the light-receiving layer 14, the first cap layer 16a, and the second cap layer 16b are stacked in order on the main surface 12a of the substrate 12. The buffer layer 18 is disposed on the main surface 12a of the substrate 12. The light-receiving layer 14 is disposed on the buffer layer 18. The first cap layer 16a is disposed on the light-receiving layer 14. The second cap layer 16b is disposed on the first cap layer 16a. An insulating film 26 and electrodes 30 are disposed on the surface of the second cap layer 16b. The array-type light-receiving device 10 includes a mesa portion 19 disposed on the substrate 12. In the embodiment, the mesa portion 19 is disposed on the buffer layer 18. The mesa portion 19 includes the light-receiving layer 14 and a semiconductor region 16. The semiconductor region 16 includes the first cap layer 16a and the second cap layer 16b. An insulating film 34 is disposed on the surface of the buffer layer 18, and an insulating film 37 is disposed on a side surface of the mesa portion 19. In the embodiment, the insulating film 34 and the insulating film 37 are simultaneously formed and are composed of the same material. The insulating film 34 has an opening on the buffer layer 18. An electrode 32 is formed in the opening of the insulating film 34. The electrode 32 is in contact with the surface of the buffer layer 18 through the opening of the insulating film 34. A wiring electrode 36 is disposed on the insulating film 37 disposed on the side surface of the mesa portion 19 and on the insulating film 26 arranged at a periphery portion of the mesa portion 19, for example. The wiring electrode 36 is connected to the electrode 32.

The buffer layer 18 is composed of, for example, grip and doped with an n-type impurity such as Si. The impurity concentration doped in the buffer layer 18 is, for example, $5\times10^{-}cm^{-3}$. The thickness of the buffer layer 18 is, for example, 0.15 μm. The light-receiving layer 14 has a type-II multi quantum well (MQW) structure. The light-receiving layer 14 is composed of a non-doped semiconductor layer, for example. The type-II multi quantum well (MQW) structure of the light-receiving layer 14 includes, for example, InGaAs layers and GaAsSb layers that are alternately stacked on top of one another. The number of the pairs of an InGaAs layer and a GaAsSb layer included in the MQW structure is, for example, 150 to 450. The thickness of the InGaAs layers is, for example, 2.5 to 5.5 nm. The thickness of the GaAsSb layers is, for example, 2.5 to 5.5 nm. The cutoff wavelength of the light-receiving layer 14 is, for example, about 2.5 μm. In other words, the light-receiving layer 14 is capable of receiving light having a wavelength shorter than the cutoff wavelength. In each of the plurality of pixel regions 24, electron-hole pairs (photocarriers) are generated in an amount corresponding to an intensity of light incident on the pixel region 24 through the rear surface 12b.

The first cap layer 16a is made of InGaAs, and the second cap layer 16b is made of InP, for example. The thickness of the first cap layer 16a is, for example, 1 μm. The thickness of the second cap layer 16b is, for example, 0.8 μm. The first cap layer 16a serves as an impurity-concentration-adjusting layer, which allows the concentration of the p-type impurity diffused in the light-receiving layer 14 through the first cap layer 16a to be controlled. The first cap layer 16a is made of a non-doped semiconductor layer, for example. The second cap layer 16b is doped with an n-type impurity such as Si. The impurity concentration in the second cap layer 16b is, for example, $4\times10^{16}$ cm$^{-3}$.

The pixel regions 24 each extend from the surface of the semiconductor region 16 (i.e., surface of the second cap layer 16b) toward the light-receiving layer 14 in the thickness direction. Each of the pixel regions 24 has a boundary inside the light-receiving layer 14 at which a p-n junction is formed. That is, the p-n junction coincides with the boundary of each pixel region 24. The pixel regions 24 are formed by selectively diffusing a p-type impurity such as zinc (Zn) from the surface of the second cap layer 16b through the first cap layer 16a.

The insulating film 26 is used for selectively diffusing the p-type impurity. The insulating film 26 is disposed on the surface of the second cap layer 16b. The insulating film 26 has a plurality of openings each located above the corresponding pixel region 24. The surface of the second cap layer 16b is exposed through the openings of the insulating film 26. The insulating film 26 is composed of for example, silicon nitride (SiN). Below the openings of the insulating film 26, the pixel regions 24 extend from the semiconductor region 16 toward the inside of the light-receiving layer 14.

The electrodes 30, which serve as p-side electrodes, are disposed on the surface of the second cap layer 16b through the respective openings of the insulating film 26. The electrodes 30 are disposed on the respective pixel regions 24. The electrodes 30 are composed of, for example, Au/Zn. The electrodes 30 are in ohmic contact with the second cap layer 16b through the respective openings of the insulating film 26. The electrodes 30 are connected to the respective read-out electrodes 40 of a read-out IC 50 through the respective humps 38. The electrode 32 is disposed beside the mesa portion 19 on the surface of the buffer layer 18. The electrode 32 is composed of, for example, Au/Ge/Ni. As described above, the electrode 32 is in ohmic contact with the buffer layer 18. The electrode 32 is connected to a common line (for example, ground line) of the read-out IC 50 through the wiring electrode 36 and the bump. The bumps 38 are composed of, for example, indium (In).

The insulating film 34 is disposed on the surface of the buffer layer 18 beside the mesa portion 19. The electrode 32 is disposed in the opening of the insulating film 34. The insulating film 34 is made of, for example, silicon oxynitride (SiON). The insulating film 37 extends along the side surface of the mesa portion 19. In the embodiment, the insulating film 37 is composed of a SiON film similarly to the insulating film 34. The wiring electrode 36 is disposed on the surface of the insulating film 37 and connected to the electrode 32. The wiring electrode 36 extends from the electrode 32 to the surface of the second cap layer 16b. The electrode 32 constitutes an n-side electrode.

The read-out IC 50 includes a circuit board 51 on which a read-out IC device and a plurality of the read-out electrodes 40 electrically connected to the read-out IC device are arranged. The plurality of read-out electrodes 40 are disposed on the main surface 51a of the circuit board 51 and electrically connected to the respective electrodes 30 of the array-type light-receiving device 10 through the respective bumps 38. The read-out IC 50 includes, for example, a multiplexer circuit device using the complementary metal oxide semiconductor (CMOS) technology as the read-out IC device.

In the array-type light-receiving device 10, the plurality of recesses 121 are disposed around the center of the rear surface 12b of the substrate 12, and the rear surface 12b includes the outer periphery region 12b1 surrounding the recesses 121. Thus, the outer periphery region 12b1 of the array-type light-receiving device 10 has a larger thickness than the recesses 121. Therefore, the substrate 12 of the array-type light-receiving device 10 has a larger mechanical strength than the substrate of an array-type light-receiving device in which the outer periphery region is not provided. In the array-type light-receiving device 10, a portion of the substrate 12 in which the recess 121 is formed has a smaller thickness than that of other portions without the recesses 121. Here, each of the portions of the substrate 12 having the recesses 121 faces one of the pixel regions 24. Thus, light incident through the recesses 121 facing the respective pixel regions 24 is less absorbed by the substrate 12 as compared with light incident through other portions of the substrate 12 in which the recess 121 is not provided. Therefore, the sensitivity of the array-type light-receiving device 10 is improved. In addition, the overall thickness of the substrate 12 is maintained relatively large so as to have a large mechanical strength. In the array-type light-receiving device 10, each of the recesses 121 has a tapered side surface 121a. Incident light on the rear surface 12b of the substrate 12 from the outside is reflected at the tapered side surface 121a of the recess 121, and then is concentrated onto the corresponding pixel region 24. Therefore, the sensitivity of the array-type light-receiving device 10 is further improved by using the recesses 121 having the tapered side surface 121a. As described above, the array-type light-receiving device 10 allows a sufficient amount of light to be incident on the pixel regions 24 while maintaining the mechanical strength of the array-type light-receiving device 10 large.

The array-type light-receiving device 10 further includes a high reflection (HR) coating 25 disposed on the tapered side surface 121a of the recesses 121. In such a case, incident light is reflected by the high reflection coatings 25 disposed on the side surfaces 121a of the recesses 121 toward the pixel regions 24 and then effectively concentrated onto the pixel regions 24.

The main steps of the method for producing the sensing apparatus 100 are described below with reference to FIGS. 5A to 7B. In Step S1 illustrated in FIG. 5A, a substrate 112 is prepared. The substrate 112 is composed of a III-V group-compound semiconductor, for example. In the embodiment, the substrate 112 is an InP substrate having a diameter of two inches. The substrate 112 is doped with an impurity such as Fe. That is, the substrate 112 is composed of a semi-insulating InP substrate. The thickness of the substrate 112 is, for example, 350 µm. A Si-doped InP buffer layer 118, which corresponds to the buffer layer 18, is formed on the main surface 12a of the substrate 112. The impurity concentration in the InP buffer layer 118 is, for example, $5 \times 10^{18}$ cm$^{-3}$. The thickness of the InP buffer layer 118 is, for example, 0.5 µm. A light-receiving layer 114, which corresponds to the light-receiving layer 14, is formed on the InP buffer layer 118. The light-receiving layer 114 has a quantum well structure including non-doped InGaAs layers and non-doped GaAsSb layers that are alternately stacked on top of one another. The thickness of the InGaAs layers constituting the light-receiving layer 114 is, for example, 5 nm. The thickness of the GaAsSb layers constituting the light-receiving layer 114 is, for example, 5 nm. The number of the pairs of the InGaAs layer and the GaAsSb layer included in the quantum well structure is, for example, about 250. A non-doped InGaAs layer 116a having a thickness of, for example, 1 µm, which corresponds to the first cap layer 16a, is formed on the light-receiving layer 114. A Si-doped InP cap layer 116b, which corresponds to the second cap layer 16b, is formed on the InGaAs layer 116a. The impurity concentration in the InP cap layer 116b is, for example, $4 \times 10^{16}$ cm$^{-3}$, and the thickness of the InP cap layer 116b is, for example, 0.8 µm. The InP buffer layer 118, light-receiving layer 114, InGaAs layer 116a, and InP cap layer 116b are successively stacked on the substrate 112 by, for example, a metal-organic vapor phase epitaxy (MOVPE) method (Step S1).

Figure 5A:
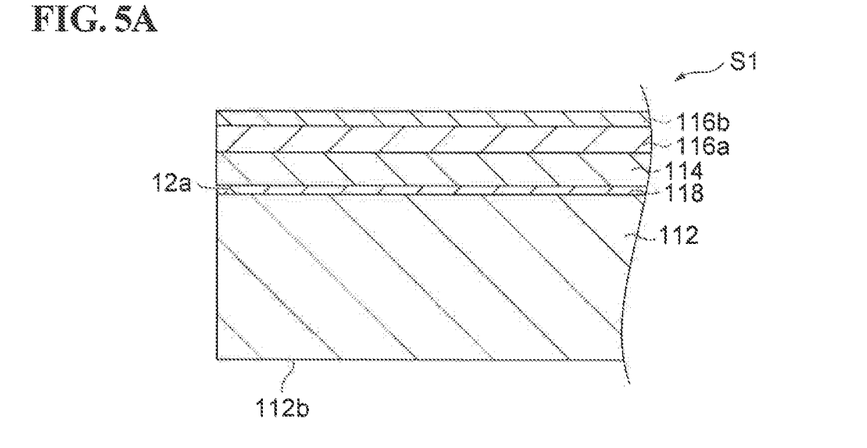
FIGS. 5A, 5B, and 5C are diagrams for explaining the main steps of a method for producing an array-type light-receiving device according to an embodiment of the present invention.
Figure 5B:
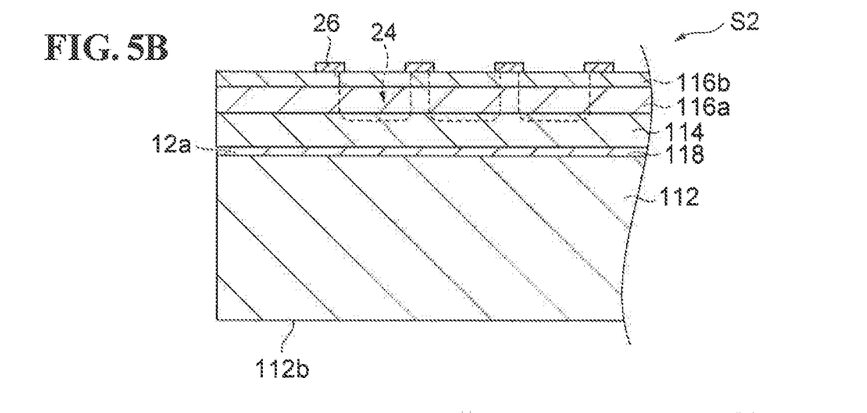

In Step S2 illustrated in FIG. 5B, a light-receiving device array in which 320×256 pixels are arranged is formed. The light-receiving device array has a pixel pitch of, for example, 30 µm. The 320×256 pixels are arranged along the surface of the InP cap layer 1161, which is parallel to the main surface 12a of the substrate 112. In order to form the light-receiving device array, a Zn impurity is selectively diffused using an insulating film 26 as a mask. The insulating film 26 is made of, for example, SiN. The light-receiving layer is made of a non-doped semiconductor and has an n-type conductivity. When the diffused front of the Zn impurity reaches inside the light-receiving layer 114, a p-n junction is formed at the boundary between the n-type light-receiving layer 114 and the p-type region formed by the diffusion of the p-type impurity. Thus, in the above-described step, the p-n junctions are formed in the pixel regions 24 that extend to the inside of the light-receiving layer 114 (Step S2).

Figure 5C:
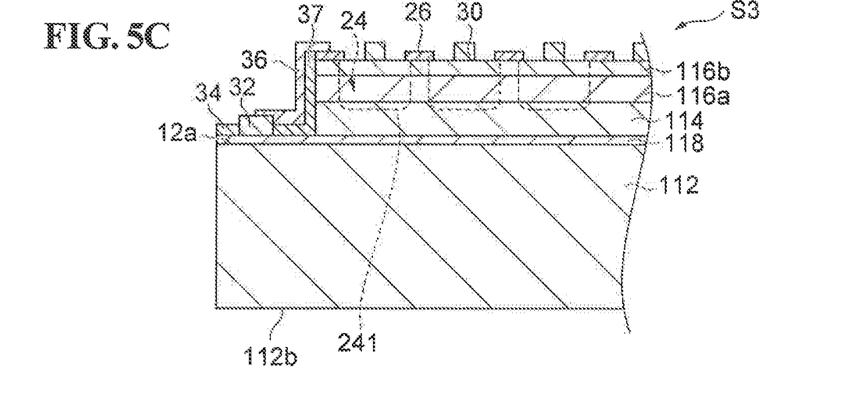

In Step S3 illustrated in FIG. 5C, electrodes 30 composed of Au/Zn, which serve as p-side electrodes, are formed on the respective pixels. Subsequently, portions of the semiconductor layers (i.e., the InP cap layer 116b, the InGaAs layer 116a, and the light-receiving layer 114) which surround the 320×256 pixels are removed by etching to form a mesa portion 19 (mesa etching step). Thus, the mesa portion 19 includes the 320×256 pixels. When the mesa portion 19 is formed, the Si-doped InP buffer layer 118 is exposed. An insulating film 34 is formed on the surface of the exposed InP buffer layer 118, and an insulating film 37 is formed on the side surface of the mesa portion 19. In the embodiment, the insulating films 34 and 37 are composed of the same insulating film such as a SiON film. An opening is formed in the insulating film 34 so that the surface of the InP buffer layer 118 is exposed through the opening. An electrode 32 composed of Au/Ge/Ni, which serves as an n-side electrode, is formed in the opening by a lift-off method, for example. The electrode 32 is in contact with the surface of the InP buffer layer 118 through the opening of the insulating film 34. Through the mesa etching step, the light-receiving layer 114 is formed into a light-receiving layer 14, the InGaAs layer 116a is formed into a first cap layer 16a, and the InP cap layer 116b is formed into a second cap layer 16b. A wiring electrode 36 composed of Au/Ge/Ni is formed on the surface of the insulating film 37. The wiring electrode 36 is connected to the electrode 32. The wiring electrode 36 extends from the surface of the InP buffer layer 118 to the surface of the mesa portion 19 (that is the surface of the second cap layer 16b) through the side surface of the mesa portion 19 (Step S3). On the surface of the mesa portion 19, the wiring electrode 36 is arranged at a position as high as the electrodes 30, which serve as p-side electrodes.

Figure 6A:
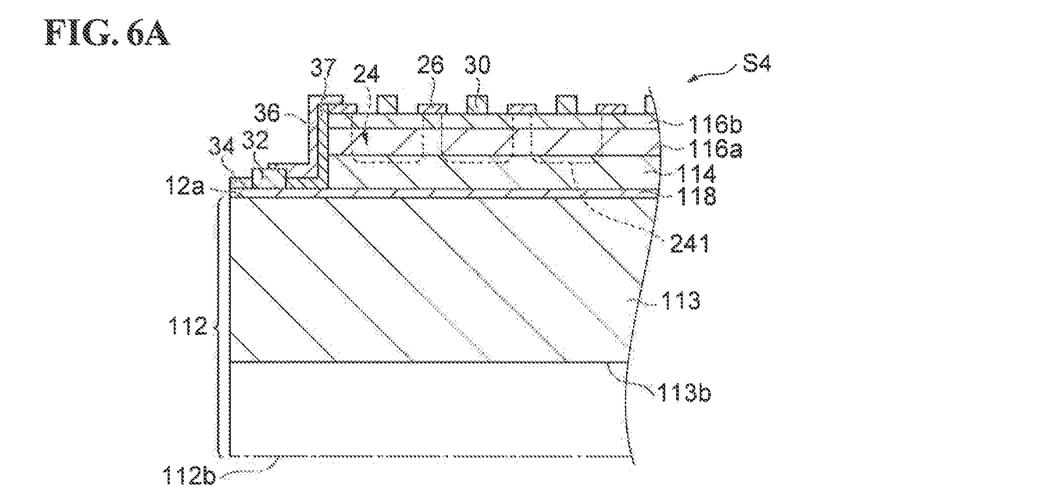
FIGS. 6A, 6B, and 6C are diagrams for explaining the main steps of a method for producing an array-type light-receiving device according to an embodiment of the present invention.
Figure 6B:
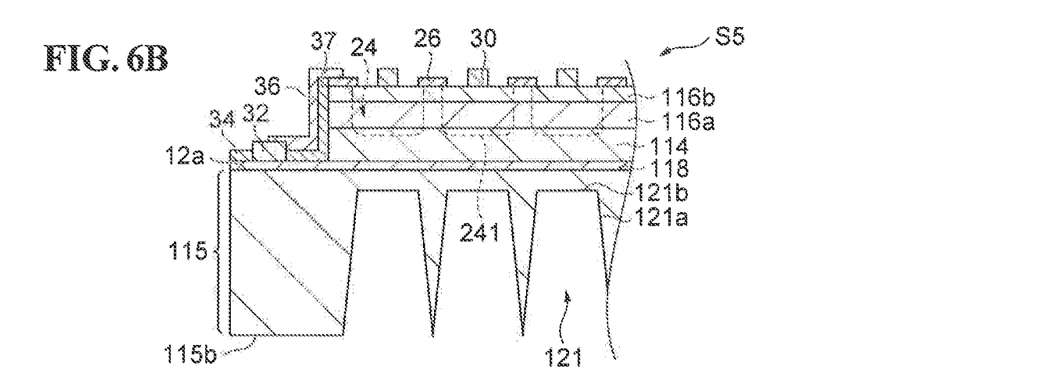
Figure 6C:
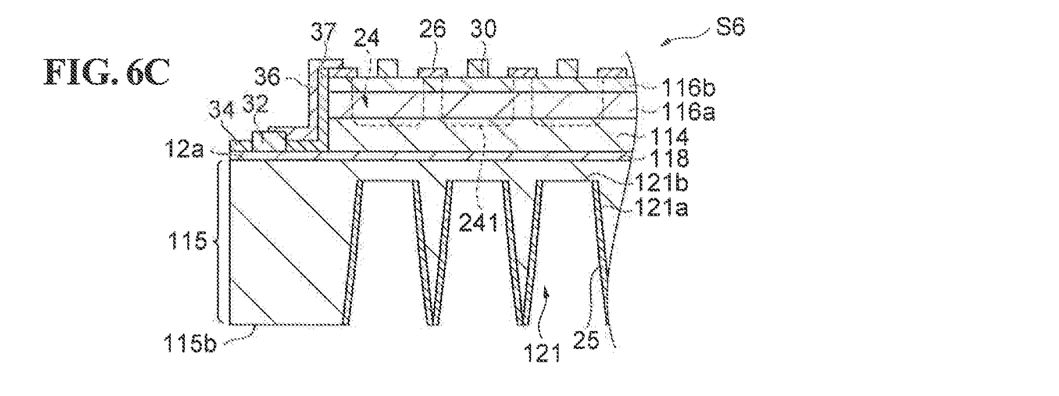

In Step S4 illustrated in FIG. 6A, the rear surface 112b of the substrate 112 is polished to a thickness of, for example, 50 µm. By polishing the substrate 112, the substrate 112 is formed into a substrate 113 and the rear surface 112b is formed into a rear surface 113b. In Step S5 illustrated in FIG. 6B, portions of the rear surface 113b are removed by dry etching. As a result, recesses 121 are formed in the rear surface 113b of the substrate 113 at positions corresponding to the pixel regions 24. The shape of the openings of the recesses 121 is, for example, a square having a diagonal line of 30 µm (i.e., 21.21-µm square) or a circle having a diameter of 30 µm. The depth of the recesses 121 is, for example, about 40 µm. The side surfaces 121a of the recesses 121 each include a tapered region inclined at an inclination angle θ with respect to the in-plane direction D1 of the main surface 12a. The inclination angle θ is, for example, 81.5°. In the embodiment, the entire side surface 121a is the tapered region. Alternatively, a portion of the side surface 121a may be the tapered region. By forming the recesses 121, the substrate 113 is formed into a substrate 115, which corresponds to the substrate 12, in which a plurality of the recesses 121 are formed. The rear surface 113b is formed into a rear surface 115b, which corresponds to a rear surface 12b, in which a plurality of the openings of the recesses 121 are formed. In Step S6 illustrated in FIG. 6C, a Au film having a thickness of 100 nm is formed on the side surface 121a of each recess 121. Through this step, a high reflection (HR) coating 25 is formed. An oblique evaporation method may be employed in order to form the Au film on the side surface 121a of each recess 121.

Figure 7A:
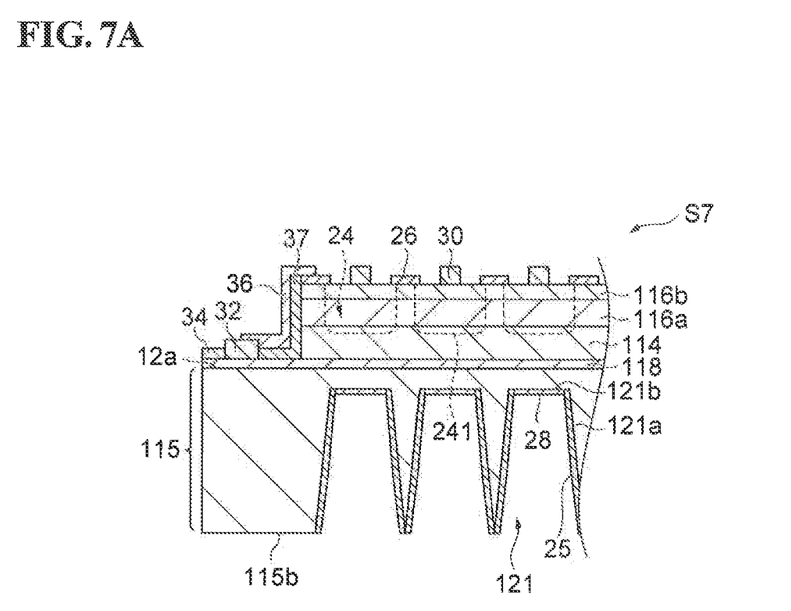
FIGS. 7A and 7B are diagrams for explaining the main steps of a method for producing an array-type light-receiving device according to an embodiment of the present invention.
Figure 7B:
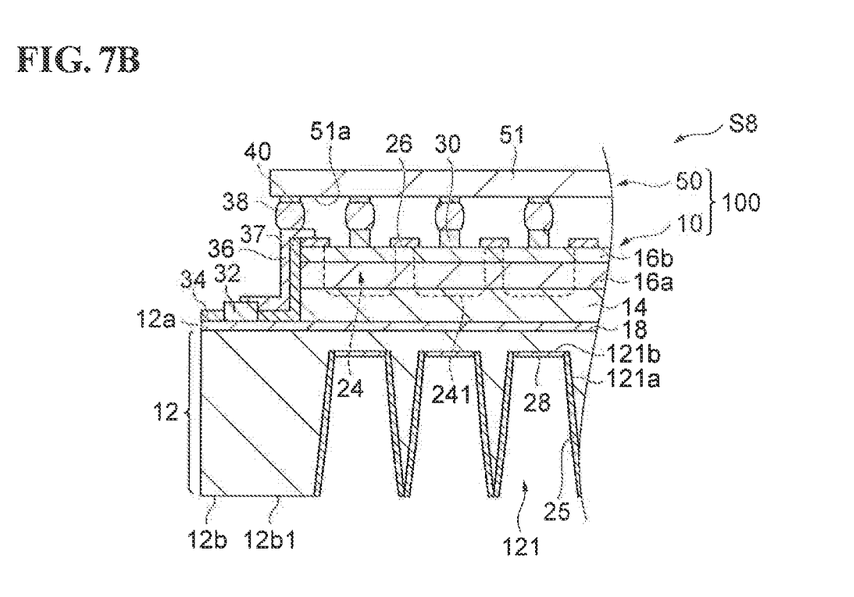

In Step S7 illustrated in FIG. 7A, an anti-reflection (AR) coating 28 is formed on the bottom surface 121b of the recess 121. The anti-reflection (AR) coating 28 is made of SiON, for example. The anti-reflection coating 28 may also cover the high reflection coating 25 deposited on the side surface 121a. In Step S8 illustrated in FIG. 7B, a plurality of the array-type light-receiving devices 10 are separated from the substrate products prepared in Steps S1 to S7 and then joined to the read-out IC 50. The read-out IC 50 is joined to the array-type light-receiving devices 10 on the p-side of the array-type light-receiving devices 10. That is, the read-out IC 50 is joined to the second cap layer 16b. The electrodes 30 of the array-type light-receiving device are joined to the respective read-out electrodes of the read-out IC 50 through the respective bumps 38. Through Steps S1 to S8 described above, a sensing apparatus 100 is formed.

Figure 8:
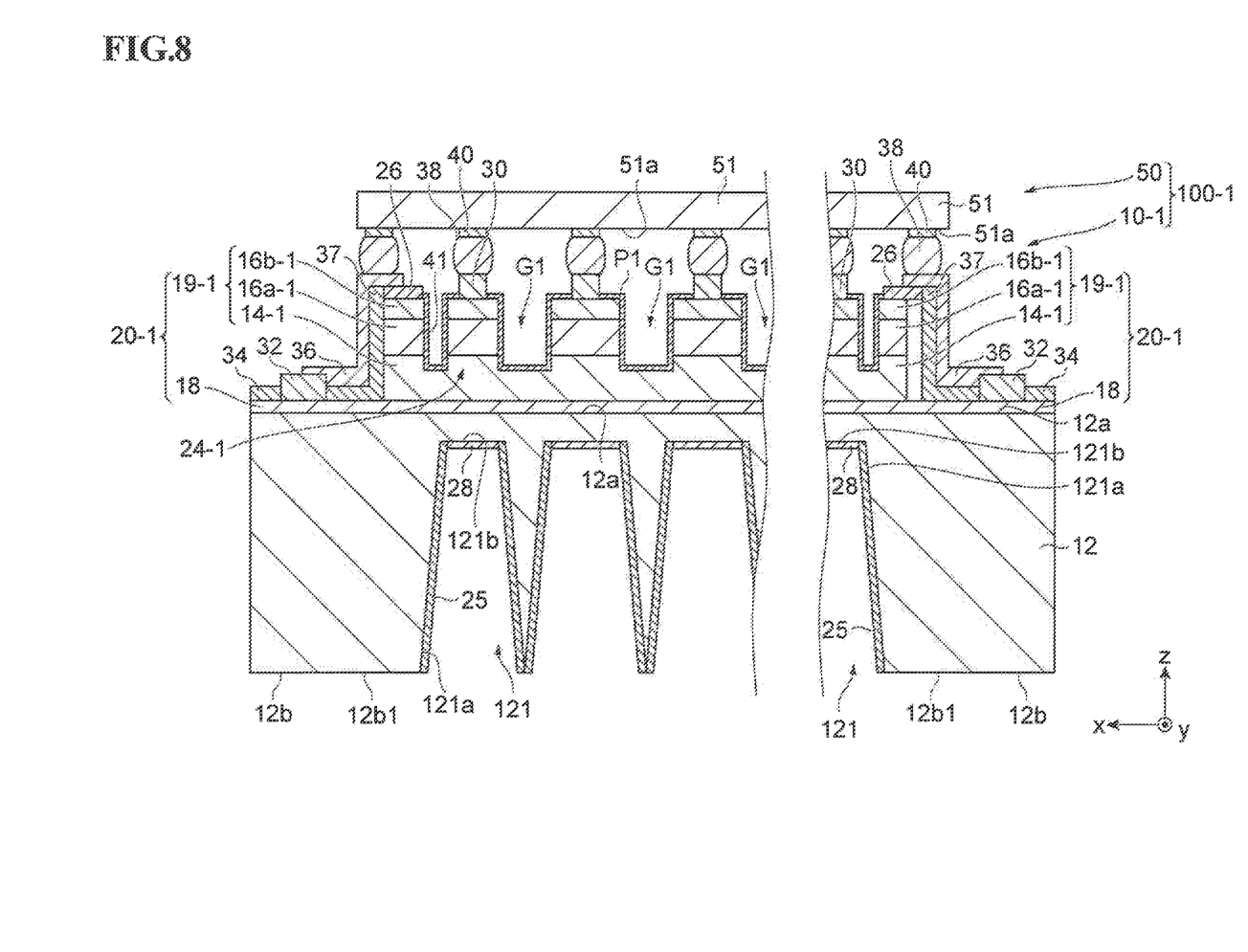
FIG. 8 is a diagram illustrating a modification of the inside of a sensing apparatus according to an embodiment of the present invention.

A modification of the sensing apparatus according to the embodiment is described Below. A sensing apparatus 100-1 according to the modification includes an array-type light-receiving device 10-1. The sensing apparatus 100-1 has the same components as the above-described sensing apparatus 100 except for the array-type light-receiving device 10-1. The array-type light-receiving device 10-1 includes a stacked semiconductor layer 20-1. The array-type light-receiving device 10-1 has the same components as the array-type light-receiving device 10 according to the embodiment described above except for the stacked semiconductor layer 20-1. The difference between the sensing apparatus 100-1 and the sensing apparatus 100 is described below. As illustrated in FIG. 8, the stacked semiconductor layer 20-1 includes a buffer layer 18 and a protection film 41. The stacked semiconductor layer 20-1 further includes a plurality of mesa grooves G1 and a plurality of mesa portions 19-1. The protection film 41 is composed of, for example, SiN and serves as an insulating film. The mesa portions 19-1 each include a light-receiving layer 14-1, a first cap layer 16a-1, and a second cap layer 16b-1. The plurality of mesa portions 19-1 correspond to a plurality of pixel regions 24-1. The plurality of pixel regions 24-1 are each defined by the corresponding mesa groove G1. That is, the plurality of pixel regions 24-1 are separated from each other by the mesa grooves G1, electrically and physically. The mesa grooves G1 are formed in the surface P1 of the stacked semiconductor layer 20-1 that is disposed opposite to the main surface 12a of the substrate 12. The surface P1 faces the main surface 51a of the circuit board 51 and also serves as a surface of the second cap layer 16b-1.

The stacked semiconductor layer 20-1 is formed by modifying Step S2 described above in the following manner. Prior to the formation of the insulating film 26 in Step S2, a p-type impurity such as Zn is diffused from the InP cap layer 116b into the light-receiving layer 114 through the InGaAs layer 116a without a mask. Subsequently, the insulating film 26 is formed. Using the insulating film 26 as an etching mask, portions of the second cap layer 16b-1, the first cap layer 16a-1, and the light-receiving layer 14-1 are removed by etching to form the mesa grooves G1 and the mesa portions 19-1. In the embodiment, the insulating film 26 is used as not the diffusion mask but the etching mask. In this step, the light-receiving layer 14-1 is etched to the middle of the light-receiving layer 14-1, and the etching of the light-receiving layer 14-1 is stopped in the middle of the light-receiving layer 14-1 so that a portion of the light-receiving layer 14-1 remains (refer to FIG. 8). After the formation of the mesa portions 19-1, the insulating film 26 is removed. The bottom and side surfaces of the mesa grooves G1 are covered with a protection film 41.

In the sensing apparatus 100-1 according to the modification, the plurality of pixel regions 24-1 are separated from each other by the mesa grooves G1, which enhances the independence of each pixel region 24-1. For the sensing apparatus 100-1, it is difficult that carriers generated in one of the pixel regions 24-1 diffuse to the other pixel regions 24-1 because the pixel regions 24-1 are separated from each other by the mesa grooves G1. Therefore, the occurrence of crosstalk between adjacent pixel regions 24-1 is reduced.

Figure 9A:
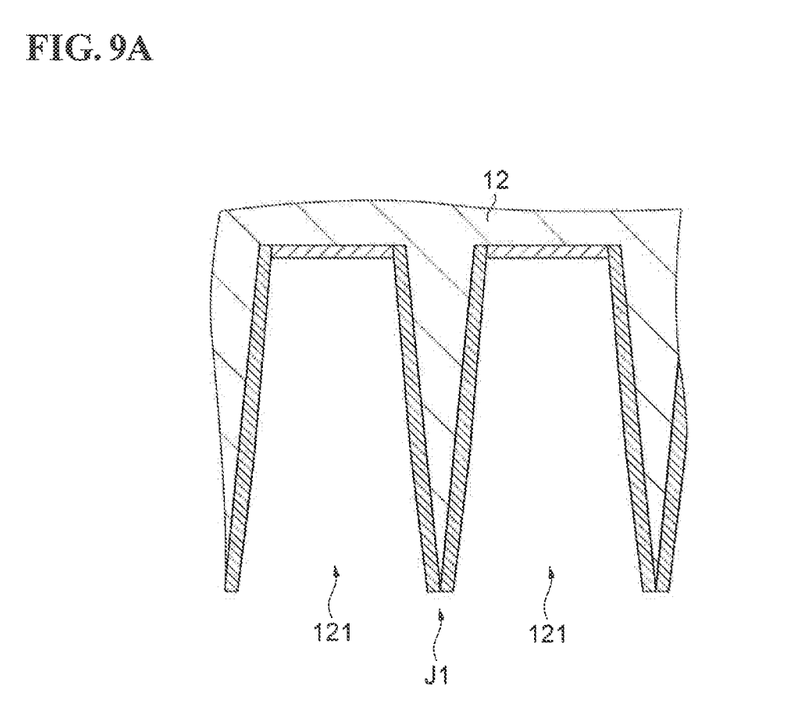
FIGS. 9A and 9B are diagrams illustrating a modification of the inside of a sensing apparatus according to an embodiment of the present invention.
Figure 9B:
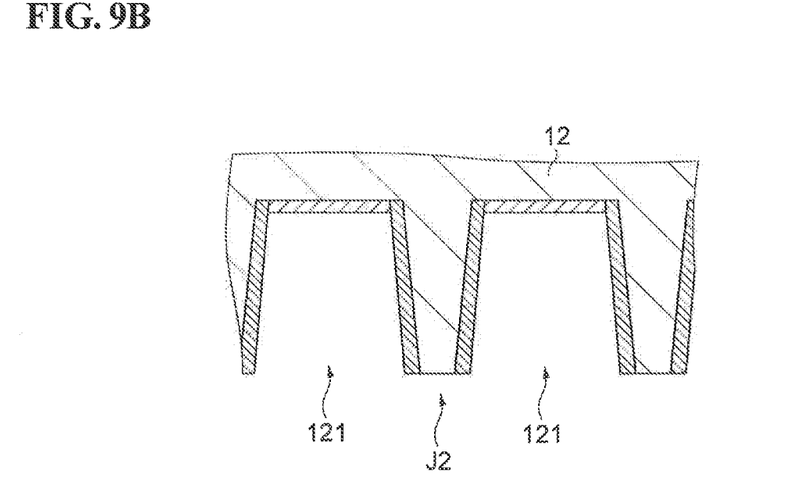

In the substrate 12, the shape of the edge portion of the region that defines each of the adjoining recesses 121 may be relatively sharp such as the edge portion J1 illustrated in FIG. 9A or may alternatively be relatively flat such as the edge portion J2 illustrated in FIG. 9B.

The present invention is not limited by the above-described embodiments, and various modifications may be made thereto without departing from the scope of the present invention. For example, the three-dimensional shape of the recesses 121 is not limited to a truncated square pyramid as illustrated in FIG. 1, but may alternatively be a truncated polygonal pyramid other than a truncated square pyramid. The three-dimensional shape of the recesses 121 may also be a circular truncated cone, a pyramid, or a cone. In the above-described embodiment, the substrate 12 is composed of InP, and the light-receiving layer 14 is composed of InGaAs/GaAsSb. Alternatively, the substrate 12 may be composed of GaSb. When the substrate 12 is composed of GaSb, the light-receiving layer 14 is composed of InAs/GaAs. In addition, the array-type light-receiving device does not necessarily include the anti-reflection (AR) coatings 28.

What is claimed is:

1. An array-type tight-receiving device comprising:
a substrate including a main surface, a rear surface, and a plurality of recesses formed in the rear surface, the rear surface including an incident plane on which incident light is received;
a stacked semiconductor layer disposed on the main surface of the substrate, the stacked semiconductor layer including a light-receiving layer; and
a plurality of pixel regions each of which includes the light-receiving layer and corresponds to one of the recesses, wherein
the recesses are each depressed from the rear surface in a thickness direction of the substrate,
each of the recesses has a bottom surface and a side surface, the bottom surface facing at least its corresponding pixel region, the side surface including a tapered region inclined at a predetermined inclination angle with respect to an in-plane direction of the main surface,
each of the pixel regions includes a light-receiving plane in the light-receiving layer, the light-receiving plane of each pixel region extending along the main surface of the substrate,
the bottom surface of each recess faces the light-receiving plane of its corresponding pixel region, and
the inclination angle satisfies the relational expression:
$90° \geq \theta \geq 45°$ and $(L2-L1)/(2 \times L3) \geq \tan(2\theta) \geq -(L1+L2)/(2 \times L3)$, where $\theta$ represents the inclination angle, L1 represents a pitch at which the recesses are arranged, L2 represents a diameter of the light-receiving lane of each pixel region, and L3 represents a distance from the rear surface to the light-receiving plane of each pixel region.

2. The array-type light-receiving device according to claim 1,
   wherein the recesses are disposed around a center of the rear surface, and
   the rear surface includes an outer periphery region surrounding the plurality of recesses.

3. The array-type light-receiving device according to claim 1, further comprising:
   a high reflection coating that reflects the incident light, the high reflection coating being disposed on at least one of the side surfaces of each recess.

4. The array-type light-receiving device according to claim 1, wherein
   each of the pixel regions includes a p-n junction in the light-receiving layer, and
   the light-receiving plane of each pixel region is substantially disposed at the p-n junction.

5. The array-type light-receiving device according to claim 1, wherein
   the plurality of pixel regions is included in the stacked semiconductor layer,
   each of the pixel regions includes a p-n junction in the light-receiving layer, and
   the p-n junction of each pixel region is formed by selectively diffusing zinc impurity from a surface of the stacked semiconductor layer.

6. The array-type light-receiving device according to claim 1, wherein
   each of the pixel regions includes a mesa portion that is defined by a mesa groove,
   each of the mesa portions includes the light-receiving layer of the stacked semiconductor layer,
   the mesa portions are disposed on the main surface of the substrate, and
   the pixel regions are separated from each other by the mesa grooves.

* * * * *